United States Patent [19]

Steele

[11] Patent Number: 5,724,302

[45] Date of Patent: Mar. 3, 1998

[54] HIGH DENSITY DECODER

[75] Inventor: Randy Steele, Folsom, Calif.

[73] Assignee: Intel Corporation, Santa Clara, Calif.

[21] Appl. No.: 801,252

[22] Filed: Feb. 19, 1997

Related U.S. Application Data

[63] Continuation of Ser. No. 499,947, Jul. 10, 1995, abandoned.

[51] Int. Cl.$^6$ ............................................. G11C 8/00
[52] U.S. Cl. ........................ 365/230.06; 365/230.01; 365/239
[58] Field of Search .................... 365/230.06, 239, 365/230.09, 230.01

[56] References Cited

U.S. PATENT DOCUMENTS

| | | | |
|---|---|---|---|
| 4,886,987 | 12/1989 | Usami | 307/465 |
| 4,953,133 | 8/1990 | Kashimura | 365/230.08 X |
| 5,109,353 | 4/1992 | Sample et al. | 364/578 |
| 5,311,479 | 5/1994 | Harada | 365/230.06 |
| 5,461,593 | 10/1995 | Kim | 365/230.06 |

*Primary Examiner*—Do Hyun Yoo
*Attorney, Agent, or Firm*—Blakely, Sokoloff, Taylor & Zafman

[57] ABSTRACT

A decoding circuit for two sequential addresses including a function gate which shares both P type input transistor devices between input terminals and uses predecoders to remove P type devices from a central portion of available die space, and N type transistor devices by utilizing a pass gate device to join output terminals for the two sequential addresses when an address is not selected.

7 Claims, 3 Drawing Sheets

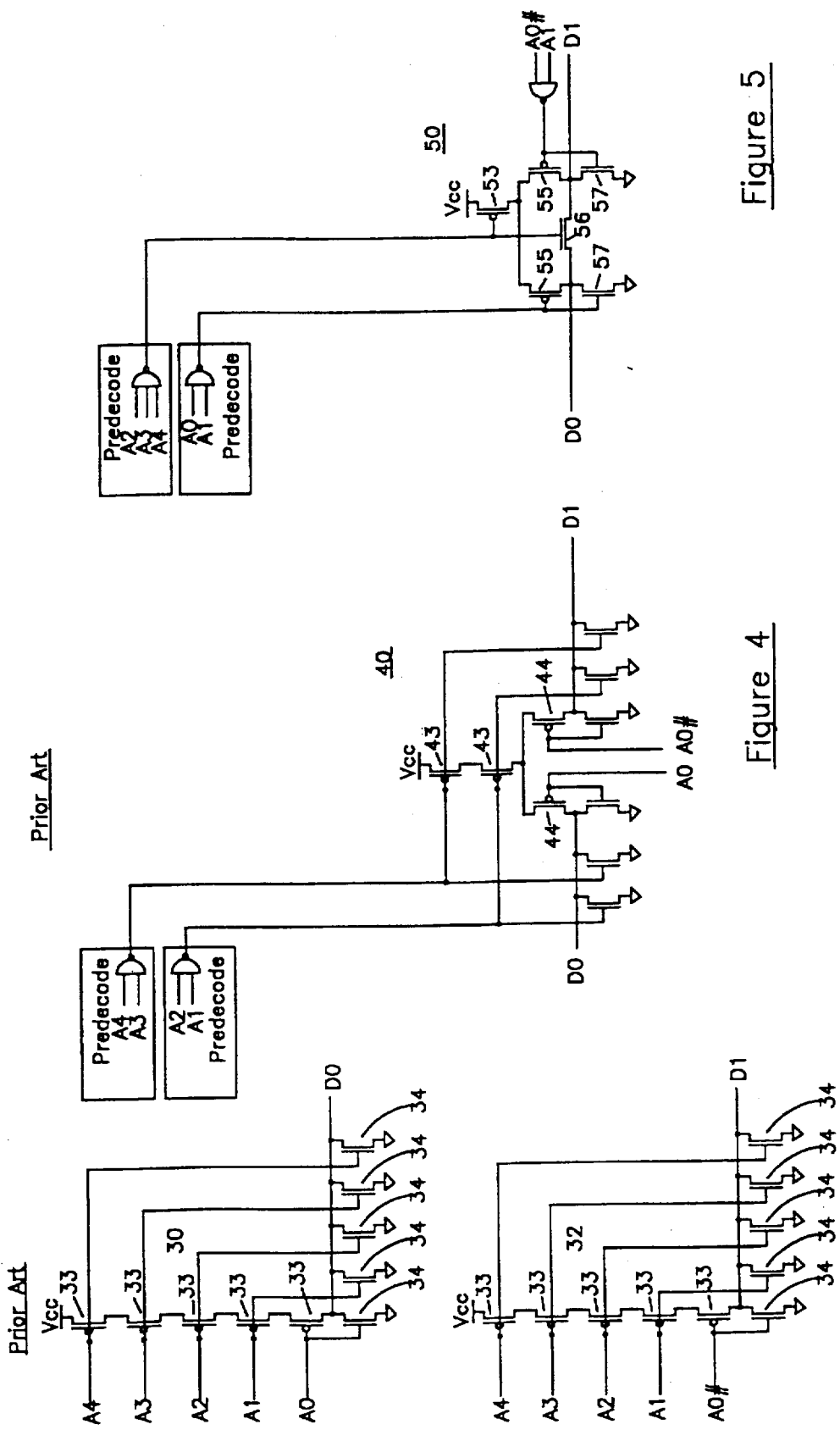

HIGH DENSITY DECODER

This is a continuation of application No. 08/499,947, filed Jul. 10, 1995, now abandoned.

BACKGROUND OF THE INVENTION

1. Field Of The Invention

This invention relates to logic circuitry and, more particularly, to address decoder logic circuitry especially adapted for use in computer systems.

2. History Of The Prior Art

In a computer system, operations are typically carried out by sending commands to particular addresses. This is typically done by associating an address with each operation. In order to send commands to addresses, decoding circuitry must be utilized to decode signals indicating those addresses. In certain types of digital circuitry, large numbers of data lines converge; and the particular lines which are to transfer data signals to be utilized must be determined by decoding address signals. Because of the convergence of data lines and associated switching circuitry, the circuit layout often becomes so crowded that room for decoding circuitry is very limited.

For example, in the prior art, it has been necessary to utilize very large number of transistor devices in order to decode addresses for programmable gate arrays. Programmable gate arrays are arrays of gates which allow a plurality of input values to be manipulated in accordance with various Boolean functions. In a basic form, such an array comprises a first series of input conductors each of which may carry a binary input value and a second series of input conductors each of which may carry the inverse of the binary input value carried by an associated one of the first series of input conductors. These first and second input conductors are selectively joined to a third series of conductors each of which is connected to a plurality of AND gates. In the basic form of programmable gate array, the output of each AND gate (a product term) is available at the input to each of a plurality of OR gates. Since any one of the input conductors may be selectively joined to each of the third series of conductors, all of the input conductors are available to each of the AND gates in this form of gate array. By connecting various AND gate outputs (product terms) to various OR gates, a particular Boolean function which is the sum of the products terms produced by the AND gates may be furnished at the output of any OR gate. Thus, the Boolean output function provided at the output of each of the OR gates is programmable by a user by programming the connections to be made between the input conductors and the conductors of the third series.

A programmable logic circuit will typically include a plurality of individual programmable gate arrays allowing Boolean logic functions to be accomplished with respect to different sets of selected input signals. Decoding circuitry controls multiplexing circuitry which selects the input signals to be routed to the individual gate arrays. As computer designs have improved, it has become desirable to increase the number of outputs and hence the number of inputs available to programmable gate arrays. There is a relatively constant ratio between the number of inputs and outputs in an array which provides optimum performance. As a larger number of input terminals is used, the size of each individual array increases dramatically as both the number of inputs and outputs increases. As will be understood, as the number of inputs and outputs increases, the amount of die space used by the array increases; and, consequently, the amount of die space available for the address decoding circuitry and the multiplexing circuitry is drastically reduced.

For example, in one recent programmable logic array, over three hundred individual conductors for input and feedback signals run through the central portion of the die. The multiplexing circuitry selects groups of the input and feedback conductors to route to the various individual programmable gate arrays to accomplish various logical functions and, consequently, must be a part of the path for those signals. The individual multiplexors which are enabled are selected by the address decoding circuitry. A number of decoding transistors are required for each transistor of the multiplexing circuitry. Typically, the address decoding circuits have appeared in die areas central to the transfer of data where very little space is available. With such a large number of signal paths and involved multiplexing circuitry, the die area available may become insufficient to hold the number of transistors required by prior art address decoding circuits.

It is desirable to reduce the die area required for address decoding circuitry, especially such circuitry which is used in programmable gate arrays.

SUMMARY OF THE INVENTION

It is, therefore, an object of the present invention to provide improved address decoding circuitry for use in digital systems.

It is another object of the present invention to reduce the number of transistors necessarily physically adjacent multiplexing circuitry in a programmable gate array.

These and other objects are accomplished in the present invention by a decoder circuit including a plurality of predecode gates which may be positioned at the extremities of the die, and a reduced number of decoders for accomplishing decode of the values of the address bits provided by the predecode circuitry, each of the decoders being arranged to provide decoding for duplicate digits of adjacent addresses normally handled by a pair of decoders and having a transfer gate for allowing duplicate use of transistors in the decoder.

These and other objects and features of the invention will be better understood by reference to the detailed description which follows taken together with the drawings in which like elements are referred to by like designations throughout the several views.

BRIEF DESCRIPTION OF THE DRAWINGS

FIG. 3 is a circuit diagram of an address decoding circuit designed in accordance with the prior art.

FIG. 4 is another circuit diagram of another address decoding circuit designed in accordance with the prior art.

FIG. 5 is a circuit diagram of an address decoding circuit designed in accordance with the present invention.

NOTATION AND NOMENCLATURE

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to a method and apparatus for operating a computer in processing electrical or other (e.g. mechanical, chemical) physical signals to generate other desired physical signals.

In this specification, a signal which includes a "#" in its name is considered to be an active low signal. The term "assert" as applied to a signal indicates that signal is active independent of whether the level of the signal is low or high. The term "de-assert" indicates that a signal is inactive.

DETAILED DESCRIPTION

Figure 1:
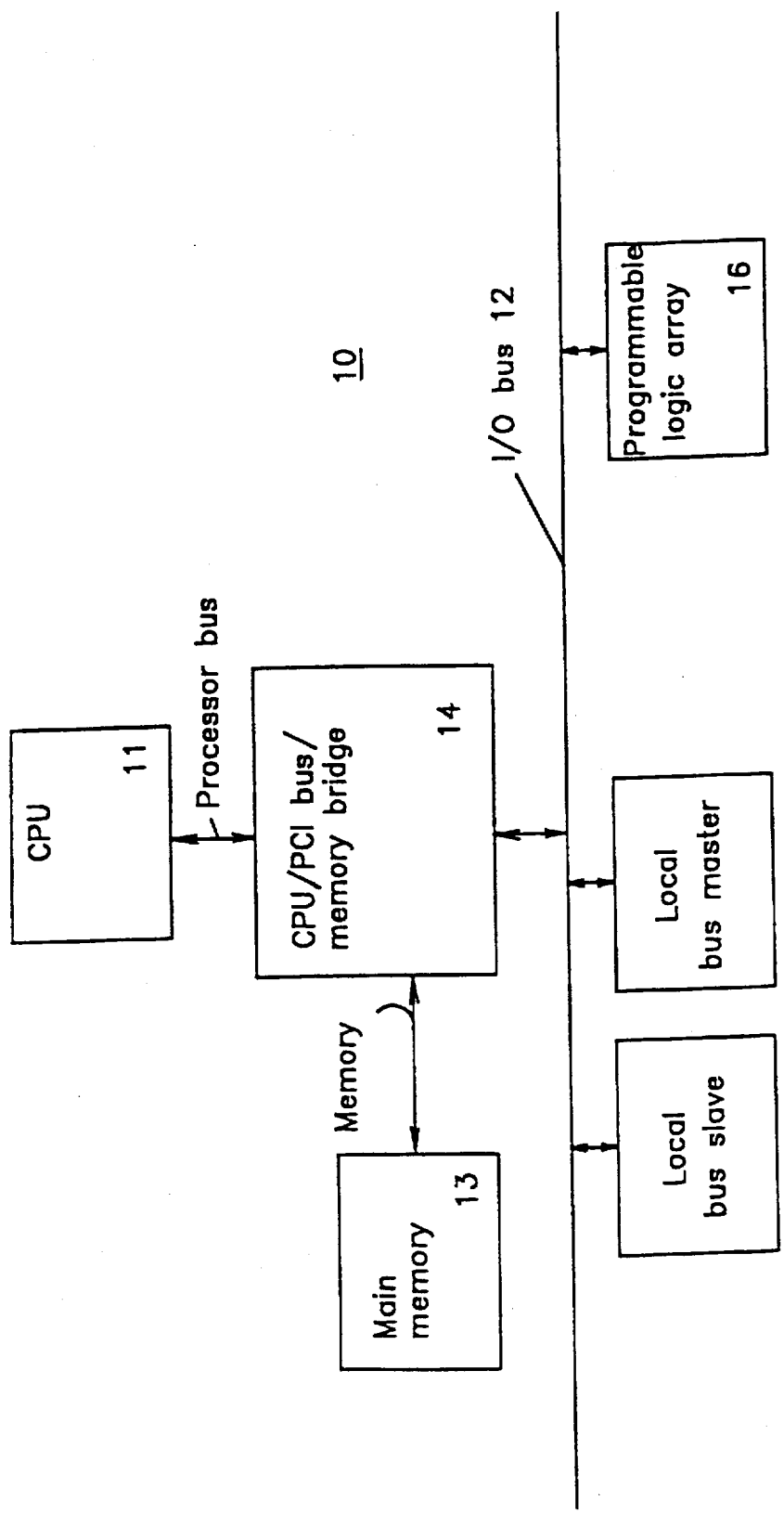
FIG. 1 is a block diagram of a computer system which may utilize the present invention.

Referring now to FIG. 1, there is illustrated a block diagram of a digital system 10 configured in accordance with one embodiment of the present invention. The present invention has application in any system, including a computer system, utilizing circuitry in which insufficient space is provided in some die area to accommodate the transistors necessary for prior art decoding schemes. The system 10 illustrated includes a central processing unit 11 which executes the various instructions provided to control the operations of the system 10. The central processing unit 11 is typically joined by a processor bus to a bridge circuit 14 which controls access to an input/output bus 12 adapted to carry information between the various components of the system 10. The bridge 14 is also typically joined by a memory bus to main memory 13 which is typically constructed of dynamic random access memory arranged in a manner well known to those skilled in the prior art to store information during a period in which power is provided to the system 10. In FIG. 1, the bus 12 is preferably a peripheral component interface (PCI) bus or other local bus adapted to provide especially fast transfers of data. In a typical system 10, various input/output devices are connected as bus master and bus slave circuits to the bus 12.

Any of the usual input/output devices typically joined to a system bus 12 may include circuitry which decodes various addresses. Some of this input/output circuitry may provide insufficient die area to position the transistors normally necessary to the address decoding functions. One particular example of such circuitry is programmable logic array circuitry 16 which provides logic circuitry which may be varied to provide different logic operations. If such circuitry provides a large number of input and output signals, then the address and data lines must be concentrated in a central portion of the layout in order to allow appropriate address decoding. Using the typical NOR gate decoding arrangements of the prior art, insufficient die space exists for all of the addresses needed.

Figure 2:
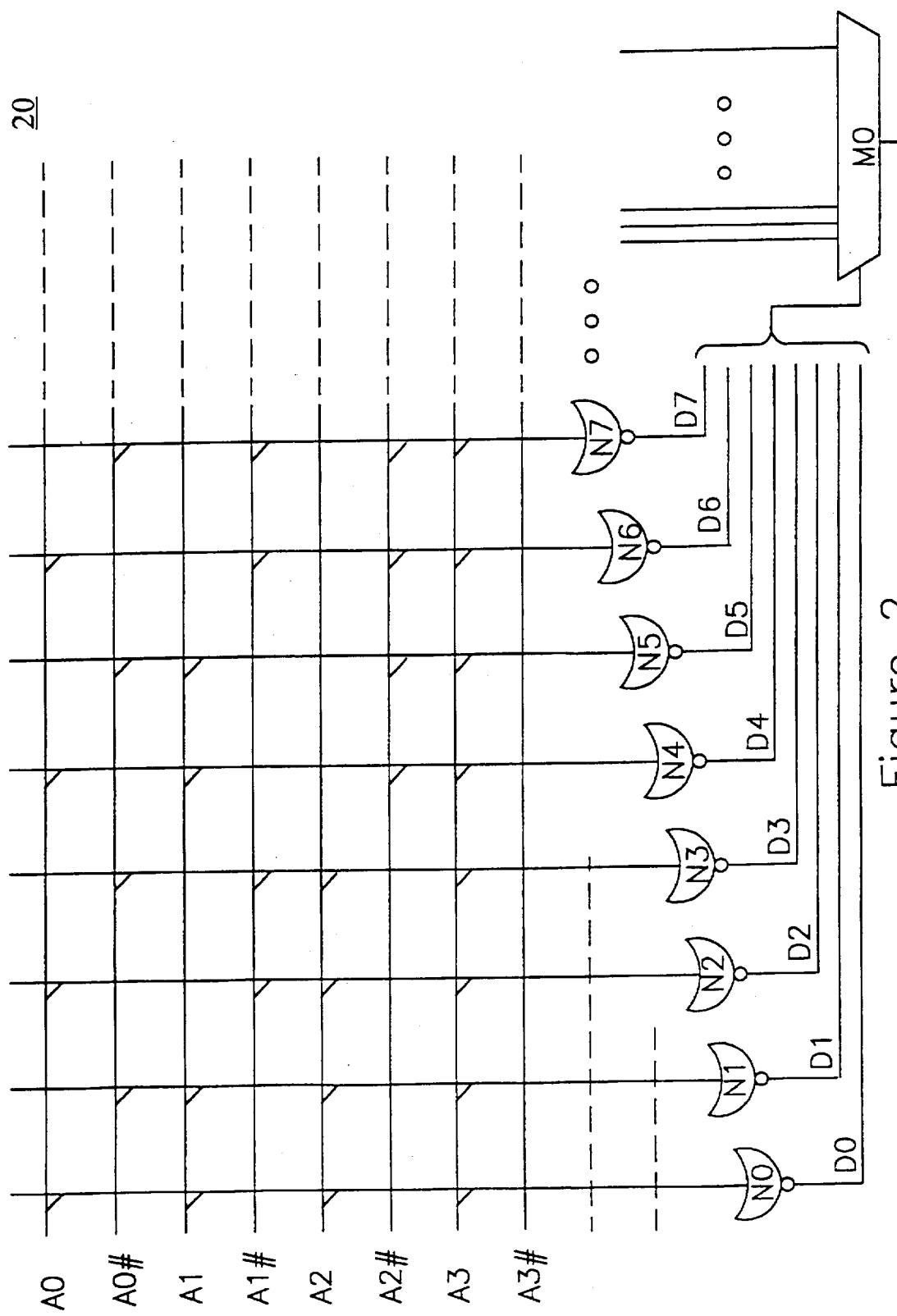
FIG. 2 is a block diagram of a portion of a programmable logic array which may utilize the present invention.

FIG. 2 illustrates a portion of decoding circuitry 20 for a programmable logic circuit 16 such as that illustrated in FIG. 1 which includes a plurality of input conductors These input conductors carry the different bits A0:A0# through A4:A4# of the address signals which accomplish decoding of addresses to enable one of twenty-four different multiplexing circuits by which data is transferred to the appropriate logic circuitry to accomplish the desired Boolean function of the circuit 16. As may be seen, the plurality of input address lines are connected to a plurality of NOR gates N0–N31 each of which produces a decode signal D0–D31 when all of the address lines joined to that NOR gate are deasserted. Thus, the input lines carrying the bits A0, A1, A2, A3, and A4 are joined to the first NOR gate N0 which provides a decode signal D0 when all of these signals A0, A1, A2, A3, and A4 are deasserted. Similarly, the input lines carrying the bits A0#, A1, A2, A3, and A4 are joined to the second NOR gate N1 which provides a decode signal D1 when all of these signals are deasserted. The decode signal D0 enables a multiplexor M0 to transfer a first data signal from thirty-two input signals, and the decode signal D1 enables the multiplexor M0 to transfer a second data signal from thirty-two input signals. In one embodiment, the arrangement is repeated twenty-four times and each multiplexor receives thirty-two individual input signals and switches one signal to particular logic selected by the multiplexor, the twenty-four multiplexors providing a total of twenty-four signals to the individual logic array.

FIG. 3 illustrates a pair of typical adjacent NOR gate address decoders 30 and 32 of the prior art. As may be seen, the decoders 30 and 32 each includes a plurality of P type field effect transistor devices 33 arranged with their source and drain terminals connected in series between a supply voltage Vcc and the drain terminals of a plurality of N type field effect transistor devices 34 each providing a path through its source terminal to ground. The gate terminal of each of the P type devices 33 is joined to the gate terminal of an associated one of the plurality of N type devices 34 and to one of the address bit input lines.

As may be seen, if all of the address bits to either of the decoders 30 or 32 are low, each of the P devices 33 in that decoder conducts placing the voltage Vcc at the drain of all of the N type devices. Since each of these N type devices 34 receives the same low signal, none of the N type devices conducts; and a high valued signal D0 or D1 is provided at the output of the decoder indicating that that address has been selected. This signal is sent to enable a multiplexor M0–M31 associated with that decoder to allow the transfer of a data signal to the logic circuitry. If, on the other hand, any of the input address signals is high, the path through the P type devices 33 is disabled; while ground is applied at the output terminal by one of the N type devices 34 indicating that the address is not selected. Thus, the address bits select one of thirty-two multiplexors M0–M31 which gate the appropriate data signals in the programmable gate array.

As may be seen, in order to select a particular pair of output addresses using this prior art arrangement, ten transistors must be used for each of the decoders (e.g., 30 and 32). Insufficient die area may exist to place the transistor devices required by the configuration of these prior art circuits adjacent the input lines and multiplexing circuitry of a programmable gate array.

FIG. 4 is a circuit diagram illustrating a first prior art attempt to reduce the number of transistors from the number used in a typical NOR address decoding circuit. The circuit 40 illustrated includes a function gate together with its predecoders; the circuit 40 utilizes a smaller number of transistors by recognizing that each of the P devices 33 of the decoders 30 and 32 of FIG. 3 except the P device receiving the lowest valued address bit receives an identical input signal to that received by the similar transistor device of the sequentially adjacent decoder. As may be seen from FIG. 2, typically four input lines to the NOR gates of adjacent decoders (beginning at the left in FIG. 2) receive signals on identical input lines while the input line carrying the lowest valued bit of the address carries input bit A0 for a first decoder and the input line carrying the lowest valued bit of the address for a next decoder caries input bit A0#. Thus, the pattern of input lines furnished to each set of sequentially-adjacent decoders carries identical input signals except for a single line in each decoder which receives one of the address bits for one decoder and the inverse of that signal for the other of the decoders. For example, in FIG. 3, decoder 30 receives input bits A0, A1, A2, A3, and A4; while decoder 32 receives input bits A0#, A1, A2, A3, and A4. For this pair of adjacent decoders, the input bits A1, A2, A3, and A4 are identical.

Since this is true, the P devices 33 of adjacent decoders may be shared. That is, the signals for the address bits A1, A2, A3, and A4 which are the same for the two decoders of FIG. 3 may be furnished to a single set of P devices 43 so long as the bits which differ in the sequential addresses to produce the two decode signals are isolated. Thus, instead of two individual decoders 30 and 32, the single decoder 40 produces the two output signals D0 and D1 for addressing the multiplexor transistors. Moreover, the decoder 40 utilizes predecoding circuitry to sum the signals from pairs of the identical input lines so that a pair of input signals are furnished on the same line. This allows the number of P channel devices 43 to be shared, and the shared devices to be reduced in number. For example, in FIG. 4, the signals for address bits A3 and A4 are ANDed (typically by means of a NAND gate) and are provided to the gate terminal of a single P type device 43. Similarly, the signals for address bits A1 and A2 are ANDed and are provided to the gate terminal of another single P type device 43.

Thus, the function gate circuit 40 of FIG. 4 has ten total transistor devices for providing the same two decoding signals D0 and D1 as were provided by the twenty transistors of the two decoders 30 and 32 of FIG. 3. This is accomplished at the expense of the using predecoding circuitry which itself includes additional gating circuitry. However, this predecoding circuitry may be positioned apart from the central portion of the die in which the input and feedback signal lines converge and the multiplexing circuitry must be positioned. Positioning the predecoding circuitry apart from the central portion of the die slows the circuitry but works well where multiplexor selection occurs relatively slowly. With many programmable logic circuits, multiplexor selection typically occurs only on power up so speed of decoding is not a problem.

There are situations where even the circuitry of FIG. 4 requires too much die area, however. The circuit 50 illustrated in FIG. 5 allows the reduction of the number of decoding transistors positioned centrally in the die area to only six total transistors (three for each of the decoding signals D0 and D1 produced). The circuit 50 utilizes additional predecoding circuitry to place a plurality of signals on the same input lines of P type transistor devices. The circuit 50, however, also allows N type devices to be shared even though the decode signals must be isolated from each other.

As with the circuit 40 of FIG. 4, the circuit 50 utilizes predecoding circuitry to sum the signals from a plurality of identical input lines so that a plurality of input signals are furnished on the same line to a single P device 53. In the embodiment illustrated, three input lines carrying the bits A2, A3, and A4 are ANDed (typically by NAND gates) so that a single P channel devices 53 is shared by these bits. In addition, two input lines carrying the bits A0 and A1 and two input lines carrying the bits A0# and A1 are also ANDed (typically by NAND gates) and drive two additional devices 55. This provides a function gate in which the total number of P devices is reduced in number even over that of the circuit 40 of FIG. 4.

In addition to sharing the P type devices, the present invention effectively allows the function gate which decodes each pair of adjacent addresses to share and thereby reduce the number of N devices to a single N type device 57 for each address even though the decode outputs must be isolated. This is accomplished by the use of a N type pass gate device 56 joining the drain terminals of the N type devices 57 of the circuit 50 and having its gate terminal connected to the gate terminal of the P type device 53. This pass gate device 56 functions to isolate the drains of the two N type devices 57 whenever the address being decoded provides low values at the gate terminal to the P device 53. Thus, as with each of the circuits of FIGS. 3 and 4, when the value at the gate terminal of the pass gate device 56 generated by the predecode of bits A2, A3, and A4 is low (the A2, A3, and A4 bits are high), the pass gate device 56 is off; and the values of the signals provided at the gate terminals of the devices 55 and 57 (representing bits A0, A1 and A0#, A1) determine whether a particular decode signal D0 or D1 is generated. If both A0 and A1 or both A0 and A1# are high so that the value at the gate terminals of the devices 55 and 57 for that address are low, a decode output signal (Vcc) is generated for that decode output D0 or D1. On the other hand, whenever one of the values representing bits A2, A3, and A4 is low and the value at the gate terminal of the pass gate device 56 is high, the pass gate device 56 is enabled so that the drains of the devices 55 are joined. This causes a low value (near ground) which must occur on at least one of the two drain terminals of the devices 55 to be transferred as the decode signal from both output terminals D0 and D1, deselecting the enable line to the multiplexor associated therewith.

The circuit 50 reduces the number of transistor devices which must be positioned in the central portion of the die area for decoding two addresses to only six thereby greatly relieving the congestion caused by using either of the circuits of the prior art.

Although the present invention has been described in terms of a preferred embodiment, it will be appreciated that various modifications and alterations might be made by those skilled in the art without departing from the spirit and scope of the invention. For example, the circuit of the present invention may be utilized with a larger or smaller numbers of input address lines without departing from the teaching of this specification. The decoding circuitry may be used with other than programmable logic circuits which are described in detail in the specification. The invention should therefore be measured in terms of the claims which follow.

What is claimed is:

1. A decoder circuit, comprising:
   a first inverting complementary transistor pair and a second inverting complementary transistor pair, each pair comprising a first transistor and a second transistor;

a control circuit generating a first input to the first inverting complementary transistor pair in response to a first plurality of address bits and generating a second input to the second inverting complementary transistor pair in response to the first plurality of address bits;

an enabling circuit for enabling the first inverting complementary transistor pair in response to a second plurality of address bits and the second inverting complementary transistor pair in response to the second plurality of address bits; and wherein the first inverting complementary transistor pair and the second inverting complementary transistor pair generate output signals in the absence of a strobe signal in response to the inputs generated by the control circuit and the output of the enabling circuit.

2. The decoder circuit of claim 1, wherein the control circuit comprises:

a first NAND gate receiving as inputs a first bit and a second bit of the first plurality of address bits, the second bit being a next least significant bit from the first bit, wherein the output of the first NAND gate is the input of the first inverting complementary transistor pair; and a second NAND gate receiving as inputs the second bit of the first plurality of address bits and a logical complement of the first bit of the first plurality of address bits, wherein the output of the second NAND gate is the input of the second inverting complementary transistor pair.

3. The decoder circuit of claim 1, wherein the enabling circuit comprises:

a NAND gate receiving as inputs the second plurality of address bits;

a pull up transistor having a source coupled to a voltage supply output, a gate coupled to the output of the NAND gate and a drain coupled to the sources of the first transistors of the first inverting complementary transistor pair and the second inverting complementary transistor pair; and a pass gate having a source commonly coupled to the drain of the first transistor and the drain of the second transistor of the first inverting complementary transistor pair, and having a drain commonly coupled to the drain of the first transistor and the drain of the second transistor of the second inverting complementary transistor pair, and having a gate coupled to the output of the NAND gate.

4. A decoder circuit, comprising:

a first circuit receiving as inputs only a first plurality of address bits, and generating a first control signal in response to the first plurality of address bits;

a second circuit receiving as inputs only a second plurality of address bits and generating a second control signal and a third control signal in response to the second plurality of address bits;

a pass gate having a source coupled to a first output node, a drain coupled to a second output node and a gate coupled to the first circuit to receive the first control signal;

a first pair of complementary transistors, comprising a first transistor and a second transistor, each having a drain coupled to the first output node and a gate coupled to the second circuit to receive the second control signal, wherein the second transistor has a source coupled to ground;

a second pair of complementary transistors, comprising a third transistor and a fourth transistor, each having a drain coupled to the second output node and a gate coupled to the second circuit to receive the third control signal, wherein the fourth transistor has a source coupled to ground; and a pull up transistor having a source coupled to a power supply output, a gate coupled to the first circuit to receive the first control signal, and a drain coupled to the source of the first transistor and the source of the third transistor.

5. The decoder circuit of claim 4, wherein the first circuit comprises a NAND gate receiving as inputs the first plurality of address bits and generating the first control signal.

6. The decoder circuit of claim 4, wherein the second circuit comprises:

a first NAND gate receiving as inputs a first bit and a second bit of the second plurality of address bits, the second bit being a next least significant bit from the first bit, to generate the second control signal; and a second NAND gate receiving as inputs the second bit and a logical complement of the first bit of the second plurality of address bits, to generate the third control signal.

7. An arrangement for decoding an address comprising a plurality of address bits, in a computer system, comprising:

a first NAND gate receiving as inputs only a first bit and a second bit of the plurality of address bits, the second bit being a next least significant bit from the first bit, to generate a first control signal;

a second NAND gate receiving as inputs only the second bit and a logical complement of the first bit of the plurality of address bits, to generate a second control signal;

a third NAND gate receiving as inputs only a plurality of the address bits;

a first pair of complementary transistors, comprising a first transistor and a second transistor, each transistor having a drain coupled to a first output node and a gate coupled to an output of the first NAND gate, wherein the second transistor has a source coupled to ground;

a second pair of complementary transistors, comprising a third transistor and a fourth transistor, each transistor having a drain coupled to a second output node and a gate coupled to the second NAND gate, wherein the fourth transistor has a source coupled to ground;

a pass gate having a source coupled to the first output node, a drain coupled to the second output node and a gate coupled to an output of the third NAND gate; and a pull up transistor having a source coupled to a voltage supply output, a drain coupled to the source of the first transistor and the source of the third transistor, and a gate coupled to the output of the third NAND gate.

* * * * *